United States Patent
Werker et al.

(10) Patent No.: US 10,840,801 B2
(45) Date of Patent: Nov. 17, 2020

(54) ARRANGEMENT FOR ACTIVELY SUPPRESSING INTERFERENCE SIGNALS

(71) Applicant: Hanon Systems, Daejeon (KR)

(72) Inventors: Stephan Werker, Merzenich-Golzheim (DE); Mario Lenz, Kerpen (DE); Stephen Newton, Ann Arbor, MI (US)

(73) Assignee: Hanon Systems, Daejeon (KR)

( * ) Notice: Subject to any disclaimer, the term of this patent is extended or adjusted under 35 U.S.C. 154(b) by 133 days.

(21) Appl. No.: 15/968,959

(22) Filed: May 2, 2018

(65) Prior Publication Data

US 2018/0342947 A1 Nov. 29, 2018

(30) Foreign Application Priority Data

May 24, 2017 (DE) .................. 10 2017 111 396

(51) Int. Cl.
| | |
|---|---|
| H05K 5/00 | (2006.01) |
| H02M 1/44 | (2007.01) |
| H05K 7/20 | (2006.01) |
| H02M 7/00 | (2006.01) |
| H05K 1/14 | (2006.01) |
| H05K 7/14 | (2006.01) |
| H05K 1/05 | (2006.01) |
| H05K 3/00 | (2006.01) |

(Continued)

(52) U.S. Cl.
CPC ............ *H02M 1/44* (2013.01); *H02M 7/003* (2013.01); *H05K 1/0218* (2013.01); *H05K 1/05* (2013.01); *H05K 1/14* (2013.01); *H05K 1/141* (2013.01); *H05K 3/0058* (2013.01); *H05K 3/368* (2013.01); *H05K 7/1407* (2013.01); *H05K 7/1427* (2013.01); *H05K 7/1432* (2013.01); *H05K 7/20936* (2013.01); *H05K 2201/066* (2013.01)

(58) Field of Classification Search
CPC ....................................................... H05K 5/00
See application file for complete search history.

(56) References Cited

U.S. PATENT DOCUMENTS

| 9,599,109 B2 | 3/2017 | Yakushiji | |
|---|---|---|---|
| 2002/0075640 A1* | 6/2002 | Zhang | G06F 1/182 361/816 |

(Continued)

FOREIGN PATENT DOCUMENTS

| DE | 102014205845 | 10/2014 |
|---|---|---|
| JP | 2007315269 | 12/2007 |

(Continued)

*Primary Examiner* — Jerry Wu
(74) *Attorney, Agent, or Firm* — Norton Rose Fulbright US LLP; James R. Crawford

(57) ABSTRACT

The invention, which relates to an arrangement (1) for the active suppression of interference signals, addresses the problem of specifying an arrangement (1) for the active suppression of interference signals, with which the reliable and secure compensation of the EMC interferences is achieved, which has a lower installation space requirement, generates less interference emission and is cost-effective of production. This problem is resolved thereby that beneath the main circuit board (12) disposed on the surface of the housing (10) a recess (14) is disposed and that in this recess (14) a circuit board (15) for the active EMC filter (4) is emplaced.

19 Claims, 2 Drawing Sheets

Figure 1:
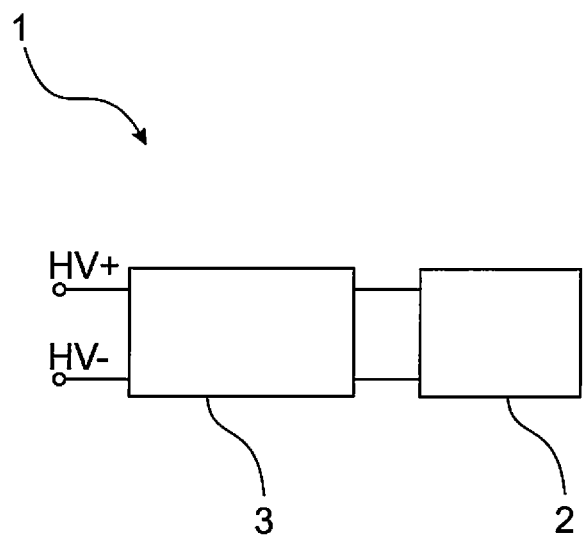

(51) Int. Cl.
H05K 3/36 (2006.01)
H05K 1/02 (2006.01)

(56) References Cited

U.S. PATENT DOCUMENTS

2011/0193452 A1* 8/2011 Yakushiji ................ F04B 39/06
 310/68 D
2014/0292401 A1 10/2014 Shen
2017/0018367 A1* 1/2017 Werker ................ H01G 9/0003

FOREIGN PATENT DOCUMENTS

| | | |
|---|---|---|
| JP | 2011001869 | 1/2011 |
| JP | 2015006028 | 1/2015 |
| JP | 2015014203 | 1/2015 |
| KR | 20170009693 | 1/1917 |
| KR | 101001583 | 12/2010 |
| WO | WO 2015/117843 | 8/2015 |

* cited by examiner

ARRANGEMENT FOR ACTIVELY SUPPRESSING INTERFERENCE SIGNALS

CROSS REFERENCE TO RELATED APPLICATIONS

This application claims priority from German Patent Application No. 102017111396.7 filed May 24, 2017, which is hereby incorporated by reference in its entirety.

The invention relates to an arrangement for the active suppression of interference signals, comprising at least one main circuit board of an inverter, an active EMC filter, a housing of a refrigerant compressor, wherein, encompassed by the housing, a coolant is disposed and wherein the main circuit board is disposed on a surface of the housing.

In electronic componentry, in which switching processes are carried out with electric voltages or currents, interferences are generated as a consequence of these switching processes due to the generated electrical pulses with the associated emission of interference signals. These interferences can propagate as electromagnetic waves conductively across lines as well as also radiatively through free space.

The capability of a technical device not to subject other devices to unintentional or accidental electric or electromagnetic effects, or be subjected to same by other devices, is referred to as electromagnetic compatibility (EMC).

To avoid or minimize the propagation of such interferences, prior art proposes equipping this componentry with a filter unit, a so-called EMC filter or network filter. It is also known to take measures for shielding or screening the electronic componentry in order to avoid impacting the correct functioning of other electronic components or devices through interference signals of too high an amplitude level.

The magnitudes of such interference signals that must be observed by a device in circulation are established in EMC standardizations associated with this device and described by means of limit values that must be observed.

Known in this context are for example the so-called ECE provisions which include a catalog of international agreements on uniform technical regulations for motor vehicles as well as parts and equipment objects of motor vehicles. The area of radio interference suppression is treated, for example, in ECE R10, which has to be followed in future developments and which will result in further decrease of the permissible interference radiation.

Electromagnetic interference radiation is also generated in the operation of electric inverters that actuate an electric motor and thus switch currents of high amplitude. Such an inverter is utilized, for example, in actuating a motor in an air-conditioner compressor of a motor vehicle.

A known solution for suppressing the interference radiation on electric or electronic components is the use of a passive EMC filters. Such passive EMC filters are conventionally realized with the aid of passive components such as capacitors, coils and resistors that are connected in known, suitable manner and thus generate the desired filter effect.

A disadvantage of passive EMC filters resides therein that these filters for filtering large interference amplitudes, or for observing appropriately low limit values, require large installation space and are also expensive in their production due to the effort that must be invested.

Another known solution for the suppression of interference emissions on electrical or electronic componentry is the use of an active EMC filter. Such EMC filters can be employed as a stand-alone unit or in combination with a passive EMC filter. This combination of active EMC filter and passive EMC filter enables reducing drastically the size of the passive elements of the passive EMC filter. While such mixed filter solutions demand higher development expenditures with respect to hardware-, computation- and simulation expenditures, these solutions, however, are also becoming of greater interest since they offer good feasibilities for meeting the increasingly lower limit values.

In an active EMC filter the reduction of unintentional or accidental emission of interference signals is achieved by means of active countersteering against the interferences. To this end, onto the interference signal is superimposed a countersignal with its phase position rotated or shifted by 180°. This technique is referred to as "active EMC filtering", active EMC filter, active EMC cancellation or Noise Cancellation.

A further aspect to be considered, in particular in highly integrated components, consist therein that an EMC filter disposed on a circuit board in a module requires certain spatial dimensions in order to unfold its filter effect optimally. This requirement results from the necessity of avoiding parasitic cross-coupling between the component parts. For example, if the filter is implemented such that the filter input is placed spatially close to the filter output, there is the risk that the interference does not follow the path attenuating the amplitude through the filter, but rather through parasitic effects, such as for example by magnetic or electric coupling from the filter input unintentionally cross-coupled to the filter output. At given installation space restrictions, this demand can also be better met by means of an active EMC filter.

In the case of a combined EMC filter comprised of a passive EMC filter and an active EMC filter, the active EMC filter assumes the task of eliminating or attenuating the low frequency interferences of relatively large amplitude, while the passive EMC filter eliminates or at least attenuates interferences of relatively higher frequencies with respect to their amplitudes, in which the active EMC filter, due to the limit frequency of the active circuit, can no longer achieve adequate effects. The limit frequency of the active EMC filter is herein customarily determined by the installed transistors and ICs.

The mode of operation of an active EMC filter can in principle be subdivided into three function blocks. The first function block is formed by a measuring unit, or a so-called detector, which measures the occurring interferences on the line of the voltage supply of the inverter. It can furthermore be provided that the amplitude of the interference signal to be measured is scaled to a level that can be processed by the phase shifter of the EMC filter. In addition, the detector according to the detected interference signal outputs a signal for a downstream phase shifter at its output.

The second function block of the active EMC filter is a phase shifter that inverts the phase of the activation signal output by the detector, such that a compensation signal is generated, whose phase, over the entirety of all subassemblies of the active EMC filter, is shifted by 180°. With the aid of the compensation signal the interference signal can subsequently be superimposed.

For this purpose, in the third function block an output amplifier is disposed that has the task of lifting the level of the output signal of the phase shifter, or to adapt it, and, as the compensation signal, to superimpose it onto the interference signals, whereby the compensation or mitigation of the detected interference has been accomplished.

The challenge encountered here is that for the suppression of an interference on a high-voltage bus with, for example, 300 V or 400 V DC, an alternating voltage of, for example, 500 mV must be impressed. The output amplifier must therefore be implemented to be robust to meet the voltage requirements. Furthermore, through the large voltage drop across the output amplifier and the operation of the amplifier in a linear operating point, power losses of several watts have to be expected. The heat, due to the occurring power losses, in the filter must therefore be securely and reliably dissipated through appropriate measures for cooling the active EMC filter.

The invention addresses the problem of specifying an arrangement for the active suppression of interference signals with which a reliable and secure compensation of the EMC interferences is accomplished, that has low installation space requirements, generates low interference emission and is cost-effective of production.

The problem is resolved through a subject matter with the characteristics according to Patent claim 1 of the independent patent claims. Further developments are specified in the dependent Patent claims 2 to 10.

In inverter applications interferences repeat in the middle and lower frequency range in a range from approximately 0.01 to 3 MHz due to the constant switching frequency of the pulse width modulation (PWM) in the activation of the electric inverter. The probability that interferences that occur once, frequently will occur again is very high. Otherwise changes occur very slowly in the arising interferences, for example through load fluctuations on a motor, due to its mechanical inertia, occur in a time range of milliseconds or seconds. The concept behind the active filtering is therefore to apply this knowledge to the control of the active EMC filter. This realization is utilized in the elimination of the interference signal in the function blocks.

A compensation signal generated under these assumptions is supplied to the third function block, in which the output amplifier is disposed. Its level is here adapted appropriately and superimposed onto the input signal of the active EMC filter whereby the compensation of the detected interference is carried out.

It is provided that the printed circuit board (PCB) or conductor board, on which the active EMC filter is disposed together with its components, is disposed on a housing of a refrigerant compressor. It can thereby be achieved that the heat generated in or on the circuit board of the active EMC filter is given off to the housing of the refrigerant compressor which forms a so-called heat sink in connection with the coolant of the refrigerant compressor.

For this purpose, prior art conventionally provides to keep the resistance to heat transfer between circuit board and housing low by using known measures (threaded fasteners or clamping connections, heat transfer compounds and others). In addition, it is also feasible to keep heat transfer resistance low between one or more components on the circuit board and the housing. As low heat transfer resistance can be viewed in the present invention a value in the range of less than 10 kelvin per watt.

It is especially advantageous to dispose the active EMC filter with its components on a separate circuit board. Apart from a conventional main circuit board, which holds the components necessary for the control of the operating function of the inverter, the arrangement of the refrigerant compressor comprises a second smaller circuit board which is only provided in order to include only the components of the active EMC filter.

This separation of the circuit boards offers the advantage that the significantly smaller circuit board of the active EMC filter can be disposed in a recess in the housing of the refrigerant compressor. The housing of the refrigerant compressor comprises for this purpose a recess that is minimally larger than the circuit board of the active EMC filter. The recess, in addition, is provided at such depth the neither the circuit board nor the components of the active EMC filter disposed on this circuit board project beyond the recess after the circuit board has been installed and secured in it.

There is consequently the feasibility of closing the recess with a cap without the active EMC filter being in contact with the side walls of the recess or the cap or forming an electric contact therewith. The floor of the recess is connected with the circuit board of the EMC filter as well as optionally also with one or more components such that it is thermally conductive. By thermally conductive is herein understood an electrically insulated connection with low heat transfer resistance which does not impair the electrical function of the active EMC The recess in one implementation is of cuboidal shape. The recess can alternatively also be cylindrical. The implementation of the recess does not affect the functionality of the invention and therefore can be adapted, for example, to the technology utilized for the generation. The recess can optionally also already be shaped into an injection mold provided for this purpose during the production of the housing of the refrigerant compressor.

It is also provided to close the recess by means of a cap. If for the housing of the refrigerant compressor as well as also for the cap an electrically conductive material is used, the complete electrical or electromagnetic shielding is attained of the circuit board of the active EMC filter installed in the recess or the hollow volume formed.

Closing the recess can take place, for example, by means of a separate cap produced of a conductive material such as, for example, iron, aluminum or copper. Such cap can be securely connected with the housing by means of some threaded fasteners, for example, and in this way generates the shielded hollow volume.

Instead of using a separate cap, it is especially advantageous to utilize the main circuit board, that is in any case necessary, of the refrigerant compressor for the control of the operating function of the inverter. For this purpose the implementation provides that the main circuit board on a side facing the housing of the refrigerant compressor, such as an underside, has at least in a defined region, denoted as shielding zone, an electrically conductive coating. Such coating, for example of copper or aluminum, can either be applied onto the circuit board of the main circuit board or, if it has already been applied onto the blank board, can be retained in the subsequent etching of the circuit board, for example, by coverage with a photoresist or etch resist.

The defined region of the conductive coating of the shielding zone is selected such that it is larger than the inside dimensions of the recess to be closed. It becomes hereby possible to establish an electric contact between the housing and the defined conductive shielding zone during the securement of the main circuit board on the housing of the refrigerant compressor. This electrical connection develops at the margin of the shielding zone and thereby generates the shielded hollow volume in which the circuit board of the active EMC filter is installed.

It is provided to equip the underside of the main circuit board with a copper layer, the size of which corresponds to the defined conductive region of the shielding zone and to securely and tightly connect it with the housing of the refrigerant compressor by means of threaded fasteners, adjusting pins, rivets or a clamp connector or adhesive bond.

In this disposition of the circuit board of the active EMC filter in the recess, and therewith parallel and underneath the main circuit board, it is especially advantageous that on the main circuit board only room needs to be provided for the terminals of the active EMC filter, such as input and output lines as well as optionally a line for the voltage supply. The space that has to be provided on the main circuit board for the active EMC filter is thereby drastically reduced.

Apart from this saving of installation space for the active EMC filter, it is also well decoupled from the main circuit board by the shielding surrounding the filter, whereby interfering effects on the main circuit board through the active EMC filter are eliminated.

Due to the low heat transfer resistance between the active EMC filter and the housing of the refrigerant compressor, the heat generated in the filter can be immediately dissipated and does not affect the thermal behavior of the main circuit board.

The improved cooling of the components of the active EMC filter permit selecting smaller, and thus more cost-effective, components in the realization of the filter.

It is furthermore provided that the thermal coupling of the circuit board of the active EMC filter, or of one or more components disposed on the circuit board of this filter, with the housing of the refrigerant compressor is improved by utilizing a thermally well conducting adhesive or a so-called thermal interface material (TIM).

The circuit board of the active EMC filter can be implemented as a single- or multi-layered circuit board. Especially advantageous is the use of a so-called insulated metal substrate (IMS) circuit board as the circuit board for the active EMC filter which, as the base material, uses aluminum as the carrier of the copper traces. Due to their aluminum carrier, such IMS circuit boards enable an especially good dissipation of the heat generated on these circuit boards.

The advantages of the present invention consequently reside in:
  a reduction of the required installation space compared to a pure all-passive implementation of the EMC filter,
  a weight reduction,
  a cost reduction,
  an improvement of the filter effect by shielding the active EMC filter against the inverter circuit board/main circuit board, as well as
  an increase of the permissible power density through active cooling of the components of the active EMC filter circuit board by the housing through which a coolant is conducted.

The application of the present invention is especially intended in the field of suppression of interference signals in inverters in electrical refrigerant compressors in electric and hybrid motor vehicles.

Figure 2:
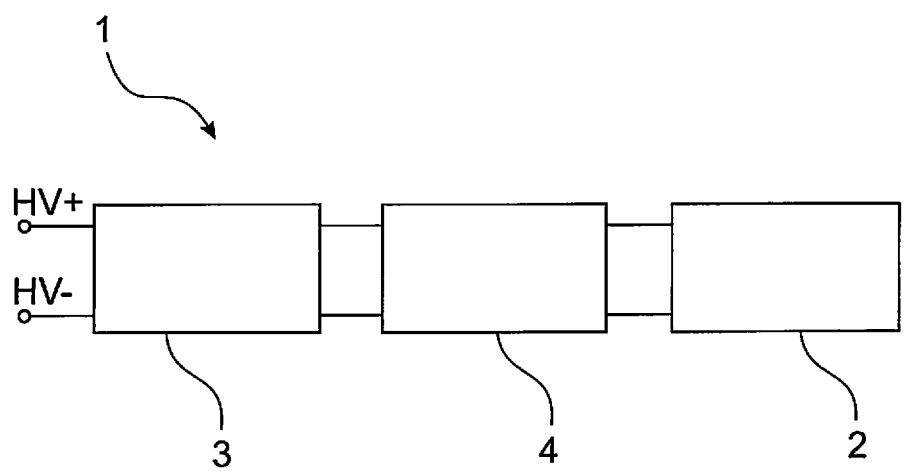
Figure 3:
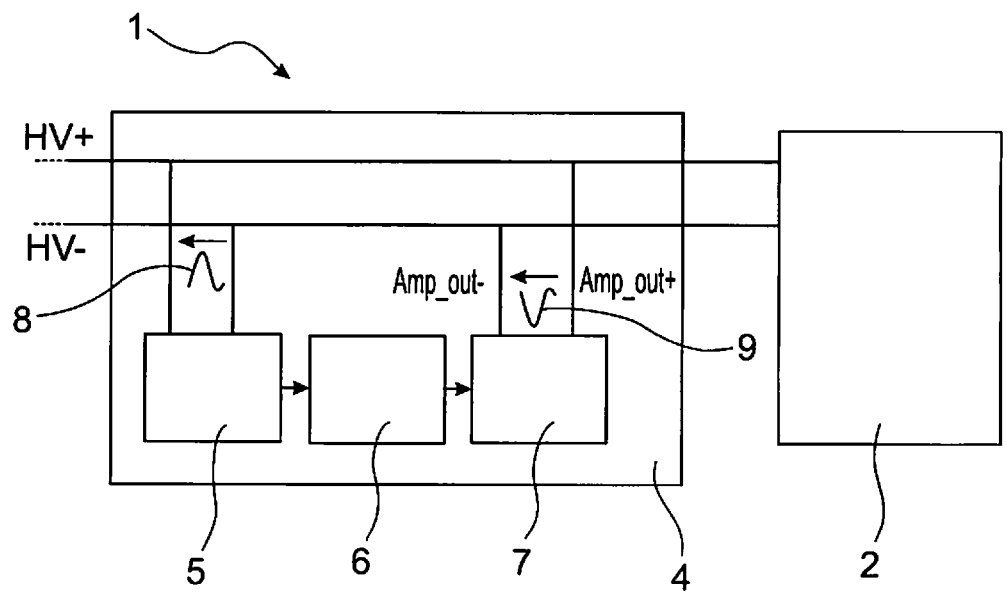
Figure 4:
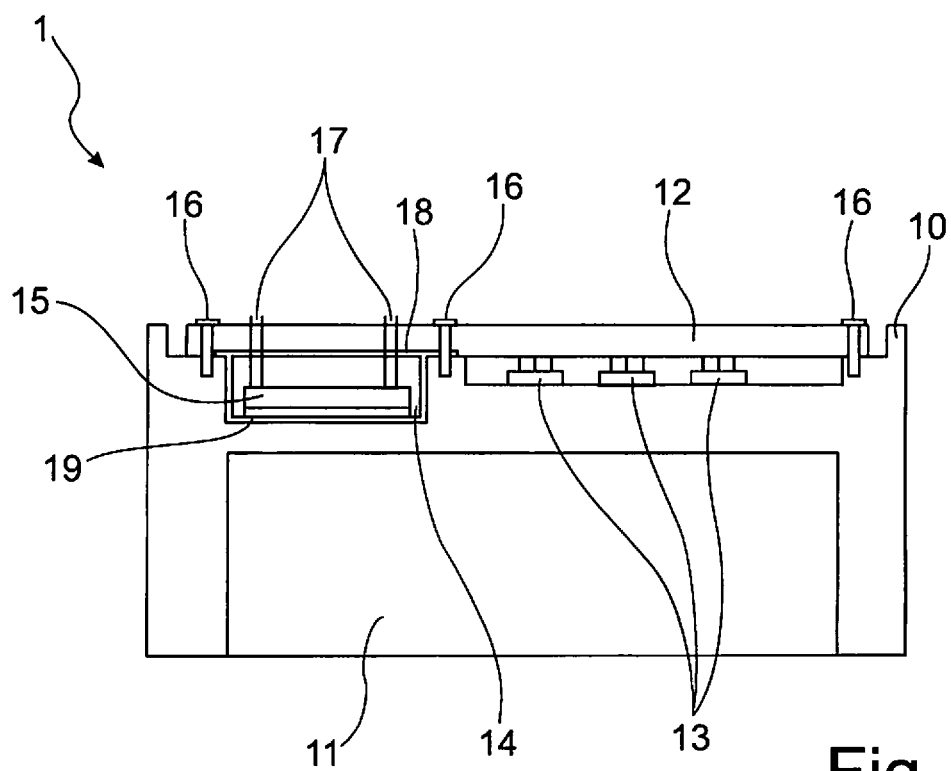

Further details, characteristics and advantages of the invention are evident based on the following description of embodiment examples with reference to the associated drawing. Therein depict:

FIG. 1: a block diagram of an EMC filter-inverter arrangement of prior art,

FIG. 2: a block diagram of an EMC filter-inverter arrangement of prior art, with a division of the filter into a passive and an active EMC filter portion, FIG. 3: a block diagram of an active filter according to the invention with its three function blocks, FIG. 4: a schematic diagram of the arrangement according to the invention of the active EMC filter in the housing of a refrigerant compressor.

In FIG. 1 is shown a block diagram of a prior art arrangement for the active suppression of interference signals 1, also referred to as EMC filter-inverter arrangement. The prior art arrangement 1 shows an inverter 2 that generates the electric control signals required for operating an electric motor, not shown, for example a refrigerant compressor, as well as a passive EMC filter 3 connected upstream of the inverter 2.

The EMC filter 3 is provided for the suppression of the interference emission of the electronic assembly of the inverter 2 and is realized, for example, with the aid of passive components, such as capacitors, coils and resistors, which in known suitable manner are interconnected with one another. At the input terminals of the passive EMC filter 3, labeled HV+ and HV−, an input-side high-voltage in the range of 300 V or 400 V is applied.

In FIG. 2 is shown a block diagram of a arrangement for the active suppression of interference signals 1 of prior art, which includes an EMC filter divided into two filter components.

Upstream of the inverter 2 in FIG. 2 is disposed an active EMC filter 4 as well as a passive EMC filter 3 connected in cascade. It is hereby intended that the active EMC filter 4 attenuates or eliminates the low frequency interferences, that can also have relatively large amplitudes, and the passive EMC filter 3 the high frequency interferences. This allocation of the filters offers an improved feasibility for the suppression of interference signals. The use of a passive EMC filter 3 is necessary since the limit frequency of the active EMC filter 4, due to the limit frequencies of the semiconductors utilized such as transistors, is potentially not high enough to provide an effective suppression of the interference signals in the entire necessary frequency spectrum.

In FIG. 3 is depicted an arrangement 1 for the active suppression of interference signals with an active EMC filter 4 comprising three function units 5, 6, 7.

The active EMC filter 4 comprises in a first function block a detector 5 that detects the interference signal 8 as well as in a second function block a phase shifter 6 which shifts the phase position of the output signal, provided by the detector 5 due to the detected interference signal 8, by 180° and thereby inverts it. In a third function unit, furthermore, an output amplifier 7 is shown which needs-based adapts the signal, phase-shifted by the phase shifter 6 in its amplitude, and outputs it as a compensation signal 9 at its outputs Amp_Out− and Amp_Out+.

The compensation signal 9 output by the output amplifier 7 is consequently superimposed on the detected interference signal 8 in its inverted form. In the case of an exact agreement of the phase positions of the interference signal 8 with the inverted compensation signal 9 and conforming amplitudes of signals 8 and 9, the suppression is obtained of the detected interference at terminals HV+ and HV− of arrangement 1 for the active suppression of interference signals.

The detector 5 as well as the phase shifter 6 can be realized, for example, by means of known operational amplifier circuits (Op amps) and are not thermally critical since the signal amplitudes to be processed are small.

For example, OPA365 or OPA552 are Op amp chips that could be utilized.

The output amplifier 7 can be implemented as a push-pull stage. Since the output amplifier 7 must be implemented in a range up to 600 V to be voltage-proof in the range of the high-volt voltage of the HV bus and must be operated in a linear operating range, an accordingly high power loss must be expected. Therefore appropriate cooling measures must be taken.

The active EMC filter 4 shown in FIG. 3 can be preceded by a, not shown, passive EMC filter 3, as was already shown in FIG. 2.

FIG. 4 shows an arrangement 1 according to the invention with an active EMC filter 4 in a housing 10 of a refrigerant compressor. Within the housing 10 of the refrigerant compressor a coolant 11 is shown which is applied in the cold production in the arrangement and is encompassed by the housing 10.

In the upper region of housing 10 a main circuit board 12 is depicted for receiving the components of the inverter 2. On this, for example, multi-layer main circuit board 12 or printed circuit board three power semiconductors 13 are depicted which are implemented, for example, as bipolar transistors with insulated-gate electrode (IGBT insulated-gate bipolar transistor). These power semiconductors 13 are directly connected thermally conducting with the housing 10 of the refrigerant compressor across a, not shown, thermal interface material and are consequently well cooled.

In FIG. 4 in a region to the left of the power semiconductors 13 a recess is inserted into the housing 10. This recess 14 is shaped such that it can receive a circuit board 15 or a printed circuit board on which the components required for the active EMC filter 4 are disposed. This circuit board 15 is also connected thermally conducting with the housing 10 of the refrigerant compressor. This connection can be accomplished, for example, by means of a, not shown, threaded fastener or clamp connection. A thermally conductive adhesive can alternatively also be utilized. A thermal interface material (TIM), such as an insulation compound or a foil can also be utilized to improve, or decrease, the heat transfer resistance between the circuit board 15 and the housing 10 in a heat transfer layer 19.

The securement of the main circuit 12 in the example of FIG. 4 takes place by means of threaded fasteners on housing 10. After the main circuit board 12 has been secured, a hollow volume 14 is formed in which the circuit board 15 of the active EMC filter 4 is disposed. The input-side and output-side electrical terminal 17 for the active EMC filter 4 can be led through the main circuit board 12 and be connected therewith. The supply of a voltage for the circuit board of the active EMC filter is provided analogously.

On the underside of the main circuit board 12 a shielding zone 18, for example in the form of a copper layer, is to be provided for shielding the active EMC filter 4. This shielding zone 18 is implemented in its extension, thus in its length as well as in its width, larger than the opening of the recess 14 and thus establishes an electrically conducting connection to the housing 10 when the main circuit board 12 is fastened to the housing 10. In this way the active EMC filter 4 is completely shielded whereby interference emissions of the filter onto the main circuit board 12 and other subassemblies are prevented.

LIST OF REFERENCE NUMBERS

1 Arrangement for the active suppression of interference signals
2 Inverter
3 Passive EMC filter
4 Active EMC filter
5 Detector (first function unit)
6 Phase shifter (second function unit)
7 Output amplifier (third function unit)
8 Interference signal
9 Compensation signal
10 Housing
11 Coolant
12 Main circuit board of inverter
13 Power semiconductor (IGBT)
14 Recess/Hollow volume
15 Circuit board for active EMC filter
16 Threaded fastener
17 Electric terminals for active EMC filter
18 Shielding zone
19 Heat transfer layer, thermally conductive layer

The invention claimed is:

1. An arrangement for the active suppression of interference signals, comprising at least one main circuit board of an inverter having input and output terminals on a first side opposite to a second side, an active EMC filter, a housing of a refrigerant compressor, wherein, encompassed by the housing, a coolant is disposed and wherein the second side of the main circuit board is disposed on a surface of the housing opposite to the coolant, wherein beneath the at least one main circuit board disposed on the surface of the housing a first recess and a second recess are disposed in the housing and that in this recess a circuit board for the active EMC filter is emplaced; and power semiconductors are in the second recess disposed on the surface of the housing; and second side of the main circuit board comprises a shielding zone of an electrically conductive material, which completely covers the recesses.

2. An arrangement as in claim 1, wherein the circuit board for the active EMC filter is connected with the housing of the refrigerant compressor across a thermally conductive layer having low heat transfer resistance.

3. An arrangement as claim 1, wherein between the circuit board and the housing an insulation compound or a thermal interface material (TIM) is disposed.

4. An arrangement as in claim 1, wherein at least one member selected from the group consisting of clamps, threaded fasteners and a thermally conductive adhesive is disposed on the surface of the housing for the securement of the circuit board.

5. An arrangement as in claim 1, wherein the circuit board is an IMS circuit board with an aluminum carrier.

6. An arrangement as in claim 1, wherein the electrically conducting material comprises at least one metal selected from the group consisting of copper, gold or aluminum.

7. An arrangement as in claim 1, wherein the electric terminals of the circuit board are disposed such that they lead through the main circuit board.

8. An arrangement as in claim 1, wherein that one or several of the components disposed on the circuit board are connected thermally conducting with the housing of the refrigerant compressor.

9. An arrangement as in claim 1, wherein on the main circuit board a passive EMC filter is disposed which at the input side is connected upstream of the active EMC filter.

10. An arrangement as in claim 1, wherein the circuit board for the active EMC filter is connected with the housing of the refrigerant compressor across a thermally conductive layer having low heat transfer resistance.

11. An arrangement as in one of claim 1, wherein a thermal interface material (TIM) is disposed between the circuit board and the housing an insulation compound.

12. An arrangement as in one of claim 2, wherein a thermal interface material (TIM) is disposed between the circuit board and the housing an insulation compound.

13. An arrangement as in claim 1, wherein at least one member selected from the group consisting of a threaded fastener, a clamp and a thermally conductive adhesive is disposed on the surface of the housing for the securement of the circuit board.

14. An arrangement as in claim 2, wherein at least one member selected from the group consisting of a threaded fastener, a clamp and a thermally conductive adhesive is disposed on the surface of the housing for the securement of the circuit board.

15. An arrangement as in claim 3, wherein for the securement of the circuit board on the surface of the housing threaded fasteners, clamps or a thermally conductive adhesive is disposed.

16. An arrangement as claim 1, wherein the circuit board is an IMS circuit board with an aluminum carrier.

17. An arrangement as claim 2, wherein the circuit board is an IMS circuit board with an aluminum carrier.

18. An arrangement as claim 3, wherein the circuit board is an IMS circuit board with an aluminum carrier.

19. An arrangement as claim 4, wherein the circuit board is an IMS circuit board with an aluminum carrier.

\* \* \* \* \*